(12) United States Patent
Kim et al.

(10) Patent No.: US 9,787,221 B2
(45) Date of Patent: Oct. 10, 2017

(54) ENERGY GENERATING DEVICE, AND METHOD OF MANUFACTURING THE SAME

(71) Applicants: SAMSUNG ELECTRONICS CO., LTD., Suwon-si (KR); Research & Business Foundation Sungkyunkwan University, Suwon-si (KR)

(72) Inventors: Seongmin Kim, Seoul (KR); Sungjin Kim, Suwon-si (KR); Sang-woo Kim, Yongin-si (KR)

(73) Assignees: SAMSUNG ELECTRONICS CO., LTD., Suwon-si (KR); RESEARCH & BUSINESS FOUNDATION SUNGYUNKWAN UNIVERSITY, Suwon-si (KR)

( * ) Notice: Subject to any disclaimer, the term of this patent is extended or adjusted under 35 U.S.C. 154(b) by 50 days.

(21) Appl. No.: 14/827,675

(22) Filed: Aug. 17, 2015

(65) Prior Publication Data

US 2016/0181952 A1 Jun. 23, 2016

(30) Foreign Application Priority Data

Dec. 19, 2014 (KR) .................. 10-2014-0184629

(51) Int. Cl.
| | |
|---|---|
| *H01L 41/113* | (2006.01) |
| *H02N 2/18* | (2006.01) |
| *H01L 41/37* | (2013.01) |
| *H01L 41/18* | (2006.01) |
| *H02S 10/10* | (2014.01) |

(52) U.S. Cl.
CPC .............. *H02N 2/18* (2013.01); *H01L 41/113* (2013.01); *H01L 41/183* (2013.01); *H01L 41/37* (2013.01); *H02S 10/10* (2014.12)

(58) Field of Classification Search
CPC ......... H02N 2/18; H02S 10/10; H01L 41/113; H01L 41/183; H01L 41/37
USPC ................................................... 310/339, 364
See application file for complete search history.

(56) References Cited

U.S. PATENT DOCUMENTS

| | | | |
|---|---|---|---|
| 8,198,789 B2 | 6/2012 | Choi et al. | |
| 8,410,563 B2 | 4/2013 | Park et al. | |
| 2010/0326503 A1 | 12/2010 | Wang et al. | |
| 2011/0050042 A1* | 3/2011 | Choi .................. | H01L 41/37 310/339 |
| 2011/0101315 A1* | 5/2011 | Choi .................. | B82Y 10/00 257/40 |
| 2011/0159342 A1* | 6/2011 | Zhang ................ | H01M 4/0402 429/124 |
| 2011/0214709 A1 | 9/2011 | Evelsizer et al. | |

(Continued)

FOREIGN PATENT DOCUMENTS

| | | |
|---|---|---|
| JP | 2013-137982 A | 7/2013 |
| KR | 10-2011-0046128 A | 5/2011 |

(Continued)

Primary Examiner — Thomas Dougherty
(74) Attorney, Agent, or Firm — Sughrue Mion, PLLC (57) ABSTRACT

An energy generating device and a method of manufacturing the same are provided. The energy generating device includes a first electrode, a metal layer, including a regular arrangement of a plurality of patterns, disposed on the first electrode, an organic material layer positioned on the metal layer, and a piezoelectric layer interposed between the first electrode and the organic material layer.

9 Claims, 13 Drawing Sheets

(56) References Cited

U.S. PATENT DOCUMENTS

| | | | |
|---|---|---|---|
| 2011/0261120 A1* | 10/2011 | Shimizu | B41J 2/161 347/71 |
| 2013/0208572 A1* | 8/2013 | Klee | B06B 1/0622 367/180 |
| 2013/0250009 A1* | 9/2013 | Ishimori | H01L 41/0805 347/70 |
| 2013/0276869 A1 | 10/2013 | No et al. | |

FOREIGN PATENT DOCUMENTS

| | | |
|---|---|---|
| KR | 10-2011-0100964 A | 9/2011 |
| KR | 10-2013-0118171 A | 10/2013 |
| KR | 10-2014-0075116 A | 6/2014 |

* cited by examiner

ENERGY GENERATING DEVICE, AND METHOD OF MANUFACTURING THE SAME

RELATED APPLICATION

This application claims priority to Korean Patent Application No. 10-2014-0184629 filed in the Korean Intellectual Property Office on Dec. 19, 2014, the entire contents of which are incorporated herein by reference.

BACKGROUND

1. Field

Apparatuses and methods related to exemplary embodiments provide an energy generating device and a method of manufacturing the same.

2. Description of the Related Art

Recently, energy harvesting technologies have been drawing a lot of attention.

Among the energy harvesting devices, an energy generating device utilizing the piezoelectric effect may be an environmentally-friendly energy device capable of converting mechanical energy, which is generated from human movements or micro-vibrations existing in the environment, into electrical energy.

Meanwhile, requirements for down-sizing devices are increased as time passes, so an energy generating device using a nano-sized piezoelectric material has been researched. A method which is currently used is a Vapor-Liquid-Solid (VLS) method, which may include a process using an explosive gas at a high temperature. The synthesized piezoelectric material tends to be grown into a state having an irregular length or arrangement.

SUMMARY

One or more exemplary embodiments may provide an energy generating device capable of more effectively obtaining energy by employing a piezoelectric layer having a uniform size and arrangement.

One or more exemplary embodiments may provide a method of fabricating an energy generating device capable of providing a uniform piezoelectric layer having high purity according to a facile and stable process.

According to an aspect of one exemplary embodiment, an energy generating device includes a first electrode, a metal layer positioned on the first electrode and comprising a regular arrangement of a plurality of patterns, an organic material layer positioned on the metal layer, and a piezoelectric layer interposed between the first electrode and the organic material layer.

The piezoelectric layer may be formed in gaps between adjacent ones of the plurality of patterns of the metal layer.

The piezoelectric layer may comprise a nanostructure.

The energy generating device may further include a first auxiliary layer interposed between the first electrode and the metal layer, where the first auxiliary layer is electrically conductive.

The first auxiliary layer may include carbon nanotubes, a conductive polymer, graphene, or a combination thereof.

The energy generating device may further include a second electrode positioned on the organic material layer.

The second electrode may be a transparent electrode.

The organic material layer may include a p-type semiconductor material, and the piezoelectric layer may include an n-type semiconductor material.

The piezoelectric layer may include a piezoelectric material selected from PVDF (polyvinylidene fluoride), zinc oxide (ZnO), lead zirconate titanate (PZT), barium titanate (BaTiO3), lead titanate (PbTiO3), aluminum nitride (AlN), gallium nitride (GaN), cadmium selenide (CdSe), silicon carbide (SiC), or a combination thereof.

According to an aspect of another exemplary embodiment, a method of manufacturing an energy generating device includes forming, on a first electrode, a metal layer comprising a regular arrangement of a plurality of patterns, forming a piezoelectric layer between adjacent ones of the plurality of patterns of the metal layer, and forming an organic material layer on the piezoelectric layer.

The piezoelectric layer may be formed using electrochemical deposition.

The piezoelectric layer may be a nanostructure.

The metal layer may be formed of aluminum oxide.

The method of manufacturing the energy generating device may further include forming a first auxiliary layer between the first electrode and the metal layer, where the first auxiliary layer is electrically conductive.

The method of manufacturing the energy generating device may further include forming a second electrode on the organic material layer.

The forming the piezoelectric layer may include applying a piezoelectric material solution between adjacent ones of the plurality of patterns of the metal layer.

DETAILED DESCRIPTION

Exemplary embodiments will hereinafter be described in detail, and may be easily performed by those who have common knowledge in the related art. However, this disclosure may be embodied in many different forms and is not to be construed as limited to the exemplary embodiments set forth herein.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

Further, unless explicitly defined to the contrary, the terms defined in a generally-used dictionary are not ideally or excessively interpreted. In addition, unless explicitly described to the contrary, the word "comprise" and variations such as "comprises" or "comprising" will be understood to imply the inclusion of stated elements but not the exclusion of any other elements. Unless specifically described to the contrary, a singular form includes a plural form.

Hereinafter, an energy generating device according to an exemplary embodiment is described with reference to the drawings.

Figure 1:
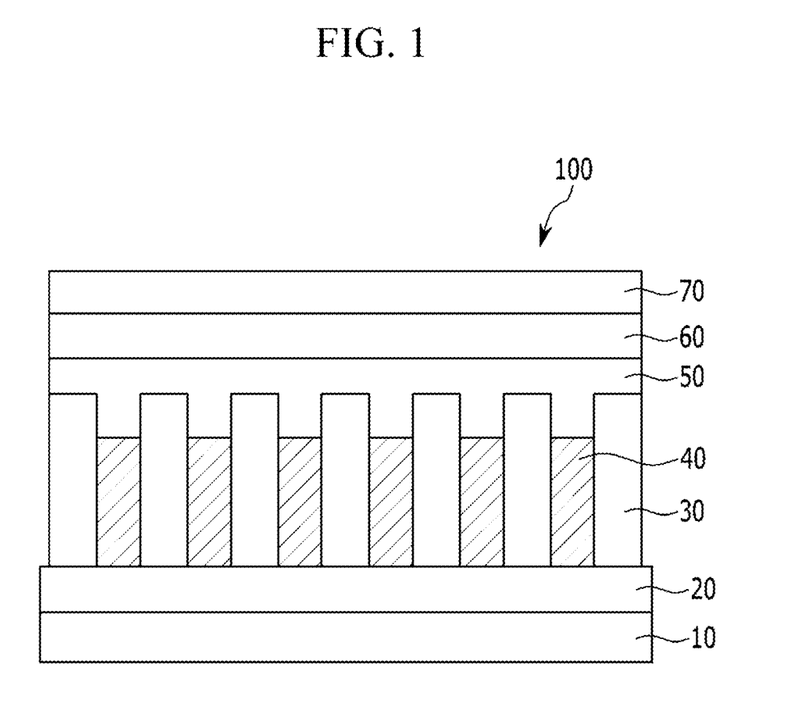
FIG. 1 is a cross-sectional view of an energy generating device according to an exemplary embodiment.

FIG. 1 is a cross-sectional view of an energy generating device according to an exemplary embodiment.

Referring to FIG. 1, an energy generating device 100 according to an exemplary embodiment includes a first electrode 10, a metal layer 30 positioned on the first electrode, an organic material layer 50 positioned on the metal layer 30, and a piezoelectric layer 40 interposed between the first electrode 10 and the organic material layer 50.

The metal layer 30 has a plurality of patterns arranged regularly. The pattern may be a nanopattern having dimensions of several nanometers to several hundred nanometers. For example, the pattern may include a hole having a diameter of several nanometers to several hundred nanometers, and the shape thereof is not particularly limited. The metal layer 30 may include a first surface facing a first electrode 10 and a second surface opposite to the first surface. When the pattern of the metal layer 30 includes holes, the holes may be formed to penetrate the metal layer 30 from the first surface to the second surface.

The metal layer 30 may include one or more kinds of metal, or oxides thereof. For example, the metal layer 30 may include aluminum oxide.

The piezoelectric layer 40 may be formed of a material having piezoelectric characteristics. Non-limiting examples of these materials may be an organic material such as PVDF (polyvinylidene fluoride) and the like, an inorganic material such as zinc oxide (ZnO), lead zirconate titanate (PZT), barium titanate (BaTiO3), lead titanate (PbTiO3), aluminum nitride (AlN), gallium nitride (GaN), cadmium selenide (CdSe), or silicon carbide (SiC), or a combination thereof, but are not limited thereto. For example, the piezoelectric layer 40 may include an n-type semiconductor material.

The piezoelectric layer 40 may be formed between adjacent patterns of the metal layer 30, and the piezoelectric layer 40 itself may be a nanostructure having a plurality of nanopatterns arranged regularly.

The organic material layer 50 may have photoelectric conversion characteristics, and may include a p-type organic semiconductor generating electron-hole excitons by adsorbing light such as sunlight. The organic material layer 50 is formed on the piezoelectric layer 40 to provide, for example, a bi-layer p-n junction structure in which a p-type semiconductor and an n-type semiconductor are formed in separate layers. The organic material layer 50 may include an organic material having semiconductor characteristics such as P3HT (poly(3-hexylthiophene)), polyaniline, polypyrrole, PPV (poly(p-phenylene vinylene)), polyvinylene, polyacetylene, polythiophene, and a derivative thereof, but is not limited thereto.

According to an exemplary embodiment as above, a piezoelectric layer 40 is disposed on the first electrode 10 and formed between adjacent patterns of the metal layer 30. A gap between adjacent patterns of the metal layer 30 may have a size of several nanometers to several hundred nanometers, and thus the piezoelectric layer 40 may be grown as a nanostructure having a uniform arrangement and size. Thereby, the area where the piezoelectric layer 40 is connected to an organic material layer 50 is further increased, so the efficiency of the energy generating device 100 may be improved.

For example, the energy generating device 100 may further include a second electrode 70 positioned on the organic material layer 50.

For example, the first electrode 10 and the second electrode 70 may independently include gold (Au), silver (Ag), aluminum (Al), copper (Cu), palladium (Pd), platinum (Pt), ruthenium (Ru), indium tin oxide (ITO), indium zinc oxide (IZO), carbon nanotubes (CNT), graphene, a transparent conductive polymer, and a combination thereof, but are not limited thereto. For example, at least one of the first electrode 10 and the second electrode 70 may include a flexible electrode capable of being deformed by the applied force. For example, at least one of the first electrode 10 and the second electrode 70 may be made of a transparent conductor such as indium tin oxide (ITO) or indium zinc oxide (IZO).

One of the first electrode 10 and the second electrode 70 may be an anode and the other may be a cathode. At least one of the first electrode 10 and the second electrode 20 may be a light-transmitting electrode. For example, the second electrode 70 may be a light-transmitting electrode, and the first electrode 10 may be a non-light-transmitting electrode. The second electrode 70 may be a light-incident electrode. The light-transmitting electrode may be made of, for example, a transparent conductor such as indium tin oxide (ITO) or indium zinc oxide (IZO), or a metal thin layer of a thin monolayer or multilayer, and the non-light-transmitting electrode may be made of, for example, an opaque conductor such as aluminum (Al) or silver (Ag).

For example, the energy generating device 100 may further include a first auxiliary layer 20 interposed between the first electrode 10 and the metal layer 30 and a second auxiliary layer 60 interposed between the organic material layer 50 and the second electrode 70.

The first auxiliary layer 20 may be formed of a conductive material, for example a metal, a conductive polymer, graphene, carbon nanotubes, ITO, or ZTO, but is not limited thereto. The first auxiliary layer 20 may electrically connect the piezoelectric layer 50 spaced in a nano-sized interval. The second auxiliary layer 60 may be one kind of adhesive layer for connecting the organic material layer 50 to the second electrode 70. A material for the second auxiliary layer 60 may be selected considering the adherence with the second electrode 70, and for example, may include molybdenum oxide (MoOx).

The energy generating device 100 according to an exemplary embodiment may be a piezoelectric solar cell which converts solar light into electrical energy. In this case, the organic material layer 50 may be a p-type semiconductor layer including an electron donor of a p-type semiconductor material, and the piezoelectric layer 40 may be an n-type semiconductor layer including an electron receptor of an n-type semiconductor material. The p-type semiconductor layer and the n-type semiconductor layer may form a bi-layer p-n junction structure including separated layers and may generate a photocurrent by transferring carriers, which are electrons and holes, separated from the interface between the organic material layer 50 and the piezoelectric layer 40.

When the energy generating device 100 is a piezoelectric solar cell, the organic material layer 50 covering the piezoelectric layer 40 receives light to separate electron-hole pairs, so the energy generation by solar light and the energy generation by piezoelectricity may be simultaneously carried out to improve the energy generating efficiency. In addition, when applying a predetermined force to the energy generating device 100, the piezoelectric potential generated from the inside of piezoelectric layer 40 influences the separation and the transmission of electrons and holes generated by the light, so that the photocurrent generation may be increased to further improve the energy generating efficiency.

Even though not shown in FIG. 1, the piezoelectric solar cell may further include one element selected from a hole transport layer (HTL), an electron blocking layer (EBL), and a combination thereof.

The hole transport layer (HTL) may facilitate the transfer of holes, and may include one material selected from poly (3,4-ethylenedioxythiophene):poly(styrenesulfonate) (PEDOT:PSS), biphenyl trithiophene (BP3T), polyarylamine, poly(N-vinylcarbazole), polyaniline, polypyrrole, N,N,N',N'-tetrakis(4-methoxyphenyl)-benzidine (TPD), 4-bis[N-(1-naphthyl)-N-phenyl-amino]biphenyl (α-NPD), m-MTDATA, 4,4',4''-tris(N-carbazolyl)-triphenylamine (TCTA), and a combination thereof, but is not limited thereto.

The electron blocking layer (EBL) may prevent the transfer of electrons, and may include one material selected from poly (3,4-ethylenedioxythiophene):poly(styrenesulfonate) (PEDOT:PSS), biphenyl trithiophene (BP3T), polyarylamine, poly(N-vinylcarbazole), polyaniline, polypyrrole, N,N,N',N'-tetrakis(4-methoxyphenyl)-benzidine (TPD), 4-bis[N-(1-naphthyl)-N-phenyl-amino]biphenyl(α-NPD), m-MTDATA, 4,4',4''-tris(N-carbazolyl)-triphenylamine (TCTA), and a combination thereof, but is not limited thereto.

Even though not shown in FIG. 1, the piezoelectric solar cell may further include one element selected from an electron transport layer (ETL), a hole blocking layer (HBL), and a combination thereof.

The electron transport layer (ETL) may facilitate the transfer of electrons, and may include one material selected from 1,4,5,8-naphthalene-tetracarboxylic dianhydride (NTCDA), bathocuproine (BCP), LiF, $Alq_3$, $Gaq_3$, $Inq_3$, $Znq_2$, $Zn(BTZ)_2$, $BeBq_2$, and a combination thereof, but is not limited thereto.

The hole blocking layer (HBL) may prevent the transfer of holes and simultaneously act as a protective layer for preventing an electrical short, and may include one material selected from 1,4,5,8-naphthalene-tetracarboxylic dianhydride (NTCDA), bathocuproine (BCP), LiF, $Alq_3$, $Gaq_3$, $Inq_3$, $Znq_2$, $Zn(BTZ)_2$, $BeBq_2$ and a combination thereof, but is not limited thereto.

Although a piezoelectric solar cell is specifically described, the energy generating device may be use in conjunction with a piezoelectric organic light emitting diode, a piezoelectric sensor, or the like.

Hereinafter, a method of manufacturing an energy generating device is described with reference to FIGS. 2 to 5.

A method of manufacturing an energy generating device according to an exemplary embodiment includes: forming a metal layer, having a plurality of patterns arranged regularly, on a first electrode (S1); forming a piezoelectric layer between adjacent patterns of the metal layer (S2); and forming an organic material layer on the piezoelectric layer (S3).

Unless mentioned otherwise, the descriptions of the first and second electrodes, the metal layer, the piezoelectric layer, the organic material layer, and the first and second auxiliary layers are the same as above.

First, a process (S1) of forming a metal layer having a plurality of patterns on a first electrode is described with reference to FIG. 2.

Figure 2:
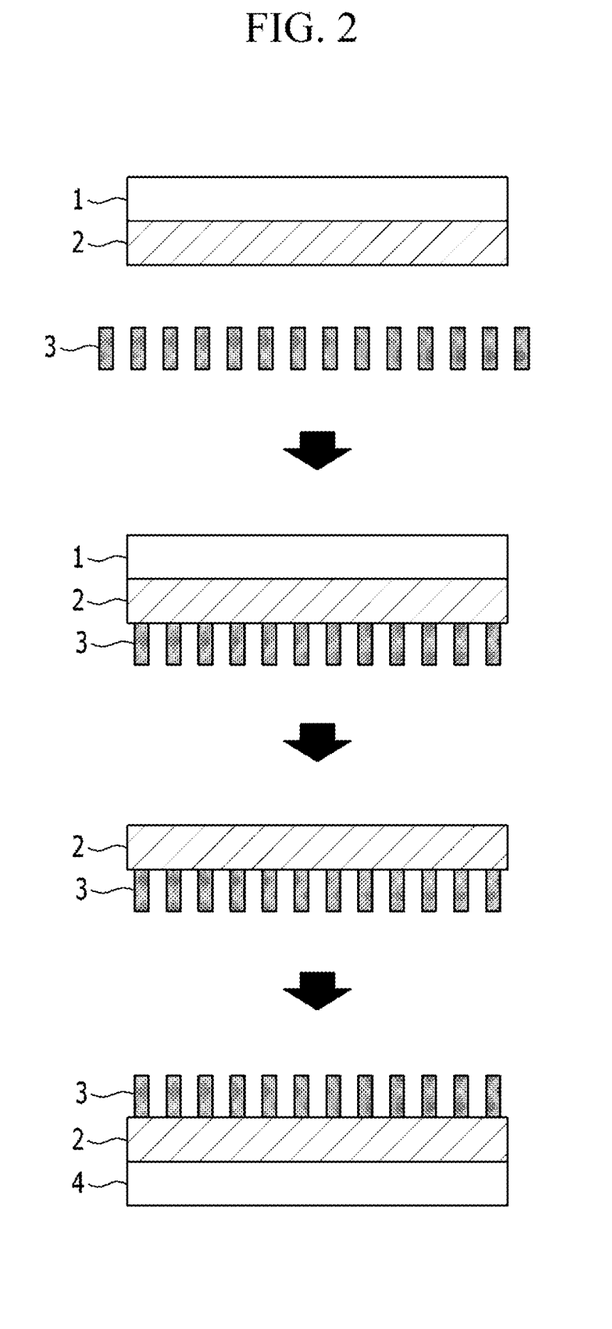
FIG. 2 illustrates a process of forming a metal layer, having a plurality of patterns, on a first electrode by a method of manufacturing an energy generating device according to an exemplary embodiment.

FIG. 2 is a view illustrating a process of forming a metal layer 3 having a plurality of patterns on a first electrode 4.

Referring to FIG. 2, a first auxiliary layer 2 is formed on one surface of a substrate 1. Subsequently, a metal layer 3 having a plurality of preliminarily prepared patterns is transmitted and formed on one surface of the first auxiliary layer 2. In this case, the gap between adjacent metal patterns may range from several nanometers to several hundred nanometers, and the size is not particularly limited. The metal layer 3 may be formed of, for example, aluminum oxide.

Subsequently, through an annealing process, the substrate 1 is removed. Then the first electrode 4 material is formed on the other surface of first auxiliary layer 2 to provide a stacked structure including the first electrode 4, the first auxiliary layer 2, and the metal layer 3. In this case, the first electrode 4 material may be applied on the first auxiliary layer 2 according to, for example, a deposition method. The first auxiliary layer 2 may prevent material of the first electrode 4 from entering between the metal patterns of the metal layer 3, and may be formed of, for example, a conductive material such as carbon nanotubes, a conductive polymer, graphene, or a combination thereof. The gap between adjacent metal patterns of the metal layer 3 may have dimensions of several nanometers to several hundred nanometers.

The substrate 1 may function as a support for the formation of the metal layer 3 on the first electrode 4, and may be formed of, for example, an inorganic material such as glass or an organic material such as polycarbonate, polymethylmethacrylate, polyethylene terephthalate, polyethylene naphthalate, polyamide, polymethylmethacrylate, and polyethersulfone.

Now, a process of forming a piezoelectric layer between adjacent patterns of the metal layer (S2) is described with reference to FIG. 3.

Figure 3:
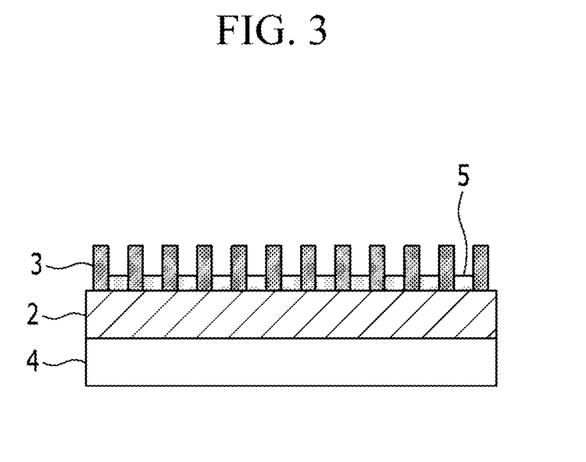
FIG. 3 is a cross-sectional view showing a structure in which a piezoelectric layer 5 is disposed between adjacent patterns of the metal layer according to an exemplary embodiment.

FIG. 3 is a cross-sectional view of a structure in which a piezoelectric layer 5 is disposed between adjacent patterns of the metal layer 3 according to an exemplary method of manufacturing an energy generating device. Referring to FIG. 3, a piezoelectric layer 5 is formed between nanopatterns of the metal layer 3. The piezoelectric layer 3 is applied between the nanopatterns of the metal layer 3 in a solution phase, and may be grown according to, for example, electrochemical deposition.

The piezoelectric material may include, for example, an inorganic material such as zinc oxide (ZnO), lead zirconate titanate (PZT), barium titanate (BaTiO3), lead titanate (PbTiO3), aluminum nitride (AlN), gallium nitride (GaN), cadmium selenide (CdSe), or silicon carbide (SiC), or a combination thereof, but is not limited thereto.

The piezoelectric layer 5 may be a nanostructure having a plurality of nanopatterns arranged regularly, and the gap between adjacent patterns of the metal layer 3 may correspond to the size of the nanopattern of the piezoelectric layer 5.

Hereinafter, a process of forming an organic material layer on the piezoelectric layer (S3) is described with reference to FIG. 4.

Figure 4:
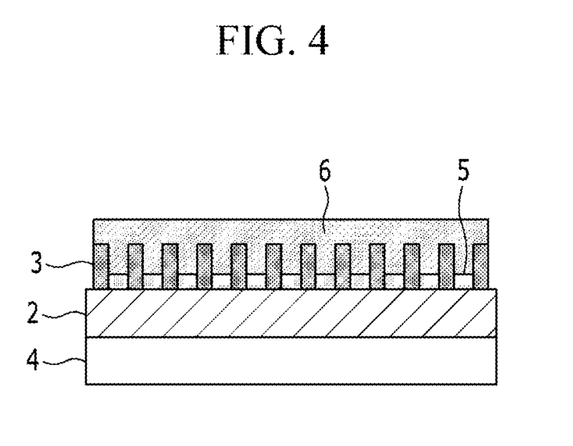
FIG. 4 is a cross-sectional view of a structure in which an organic material layer is disposed on the piezoelectric layer according to an exemplary embodiment.

FIG. 4 is a cross-sectional view of a structure in which an organic material layer 6 is formed on the piezoelectric layer 5 according to an exemplary method of manufacturing an energy generating device. Referring to FIG. 4, the organic material layer 6 covers the entire upper part of the metal layer 3 and the piezoelectric layer 5. The organic material of the organic material layer 6 may include a p-type semiconductor material that forms a p-n junction with the piezoelectric material of the piezoelectric layer 5, and may include, for example, P3HT (poly(3-hexylthiophene)), polyaniline, polypyrrole, PPV (poly(p-phenylene vinylene)), polyvinylene, polyacetylene, polythiophene, and a derivative thereof, but is not limited thereto. The organic material layer 6 may be formed by coating it on the metal layer 3 and the piezoelectric layer 5 according to a solution process and drying the same, wherein the solution process may include, for example, spin coating, slit coating, inkjet printing, or the like. The solvent used in the solution process is not particularly limited, but may be appropriately selected by a person of ordinary skill in the art considering the solubility of the organic material used.

Figure 5:
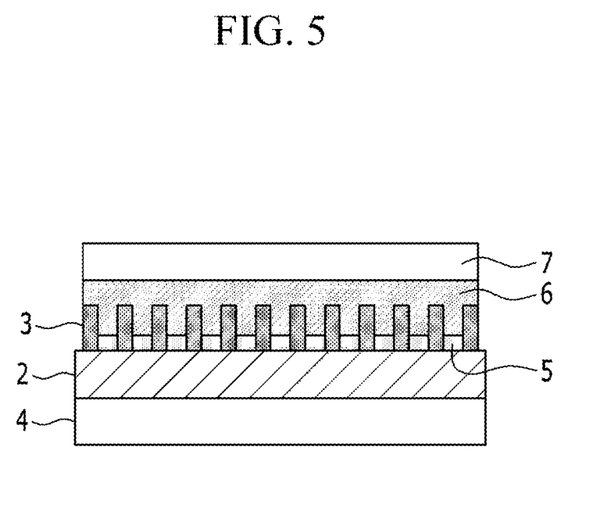
FIG. 5 is a cross-sectional view of a structure in which a second electrode is disposed on the organic material layer according to an exemplary embodiment.

Subsequently, as shown in FIG. 5, a second electrode 7 may be formed on the organic material layer 6 according to a deposition method, and the second electrode 7 may be a transparent electrode.

According to this exemplary method of manufacturing an energy generating device, a piezoelectric layer having a nanostructure is formed by using the metal layer having nano-interval arranged patterns as a template, so the piezoelectric layer may be provided in a wider area and may be vertically grown in an elaborate level. In addition, the piezoelectric layer may be formed at a relatively low temperature according to an electrochemical deposition, so the process stability may be enhanced.

Hereinafter, specific examples of exemplary embodiments are described. However, these examples are exemplary, and the present disclosure is not limited thereto.

Energy Efficiency Evaluation 1

A piezoelectric solar cell is evaluated for energy efficiency improvement using a simulation.

The simulation uses a COMSOL program. The COMSOL program is used to estimate how the piezoelectric potential influences the dissociation rate of the separated carrier formed by light, and shows a carrier dissociation rate according to pressure.

Figure 6:
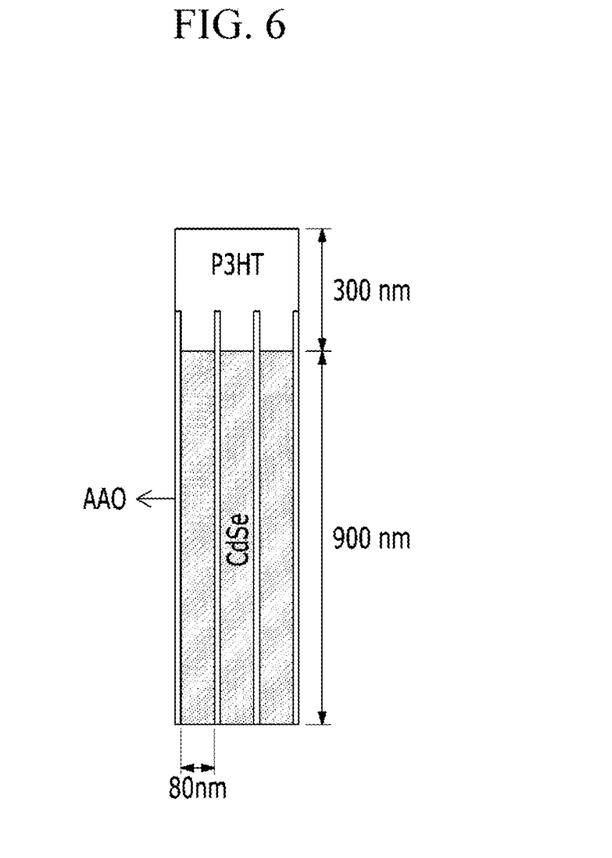
FIG. 6 is a cross-sectional view of a piezoelectric solar cell designed according to an exemplary embodiment.

The piezoelectric solar cell is assumed to include a 900 nm-thick CdSe layer (n-type semiconductor layer) as a piezoelectric layer, a 300 nm-thick P3HT layer (p-type semiconductor layer) as an organic material layer, and a metal layer of anodic aluminum oxide (AAO), and the piezoelectric layer is assumed to have an 80 nm-sized nanostructure. When each of pressures of 0 N, 3N, 6N, 9N, 12N, and 15N is applied from the upper side to the lower side of the piezoelectric layer, while assuming that each carrier concentration of the CdSe layer and the P3HT layer is $1 \times 10^{16}$ #/cm$^3$, a potential is measured according to a height of the piezoelectric solar cell. FIG. 6 is a cross-sectional view of the piezoelectric solar cell, and FIG. 7 is a graph showing a potential according to a height of the piezoelectric solar cell.

Referring to FIG. 6, the height of the piezoelectric solar cell at the lowest end of the CdSe layer is 0, and the height of the piezoelectric solar cell at the highest end of P3HT layer is 1200 nm.

Figure 7:
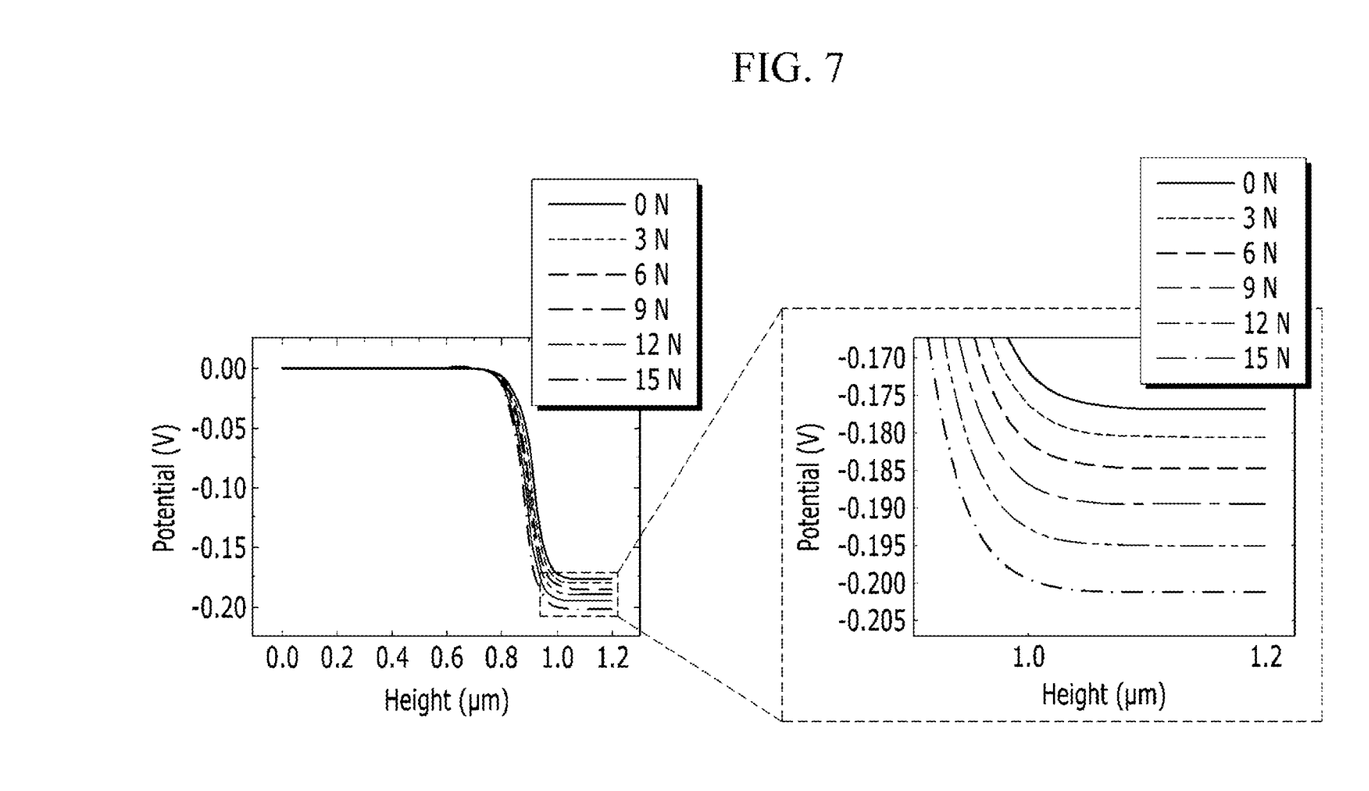
FIG. 7 is a graph showing a voltage according to a height of an exemplary piezoelectric solar cell.

Referring to FIG. 7, it is understood that a negative piezoelectric potential is generated at the interface between the piezoelectric layer and the organic material layer when applying a force (3 N, 6 N, 9 N, 12 N, and 15 N) from the upper part to the lower part of the piezoelectric layer, and the piezoelectric potential is slightly decreased in the cases of applying a force (3 N, 6 N, 9 N, 12 N, and 15 N) as compared to the case of not applying a force (0 N).

Figure 8:
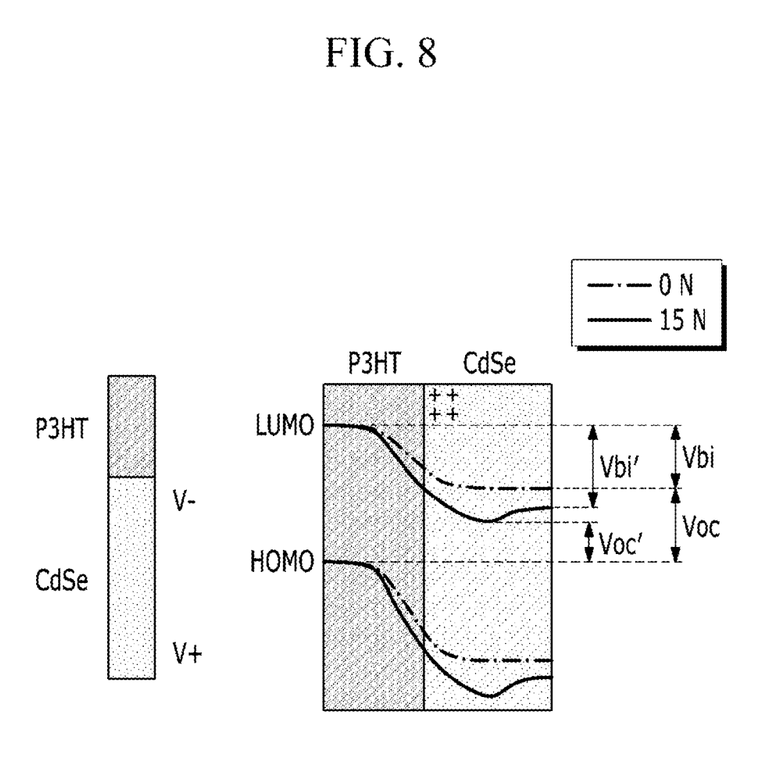
FIG. 8 is a graph showing HUMO (highest unoccupied molecular orbital) and LUMO (lowest unoccupied molecular orbital) levels according to a height of an exemplary piezoelectric solar cell.

FIG. 8 is a graph showing HUMO (highest unoccupied molecular orbital) and LUMO (lowest unoccupied molecular orbital) levels according to a height of the piezoelectric solar cell.

Referring to FIG. 8, it is understood that when applying a force of 15 N from the upper part to the lower part of the piezoelectric layer, the open-circuit voltage (Voc') is decreased by as much as about 1 time as compared to the open-circuit voltage (Voc) in the case when no force (0 N) is applied. In addition, referring to FIG. 8, it is understood that when a force of 15 N is applied from the upper part to the lower part of piezoelectric layer, the built-in potential ($V_{bi}'$) is increased by a predetermined level as compared to the built-in potential ($V_{bi}$) when no force is applied.

Figure 9:
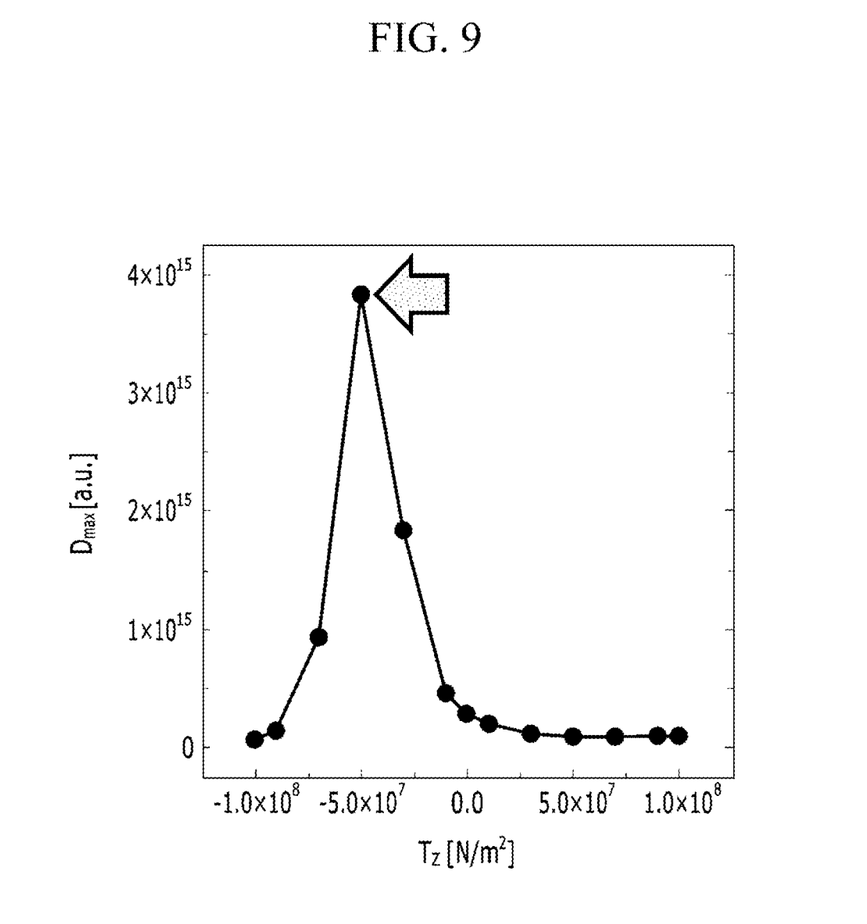
FIG. 9 is a graph showing a carrier dissociation rate according to a pressure of an exemplary piezoelectric solar cell.

FIG. 9 is a graph showing a carrier dissociation rate according to the pressure applied to the piezoelectric solar cell. In FIG. 9, the absolute value of Tz refers to a magnitude of pressure applied along the Z axis, and the signal of Tz is defined as negative (−) when the pressure is applied from the upper part to the lower part, and it is defined as positive (+) when the pressure is applied from the lower part to the upper part.

Referring to FIG. 9, when the predetermined pressure is applied from the upper part to the lower part of the piezoelectric layer along the z axis (Tz=about $-5.0 \times 10^7$ N/m$^2$), a maximum value (Dmax) of the carrier dissociation rate of the piezoelectric solar cell is increased by about 8 times as compared to a case in which no pressure (Tz=0) is applied. Thus, when the predetermined pressure is applied along the z axis from the upper part to the lower part of the piezoelectric layer, the short current (Isc) of the piezoelectric solar cell may also increase by about 8 times as compared to a case in which no pressure is applied.

Therefore, when the energy efficiency of the solar cell is calculated according to the following Calculation Equation 1, it is estimated that the energy efficiency of the piezoelectric solar cell is increased by at least 4 times as compared to a case in which no force (stress) is applied.

$$\eta_{con\text{-}efficiency} = \frac{P_{max} = I_{sc} V_{ac} FF}{P_{in}} \qquad \text{Calculation Equation 1}$$

In addition, referring to FIG. 9, it is confirmed that the carrier dissociation rate is not increased as the pressure is further increased, but rather, the carrier dissociation is increased by applying pressure within a predetermined range. Thereby, it is estimated that the efficiency of the piezoelectric solar cell may be controlled within a desirable level by selecting a predetermined ranged pressure.

Energy Efficiency Evaluation 2

Figure 10:
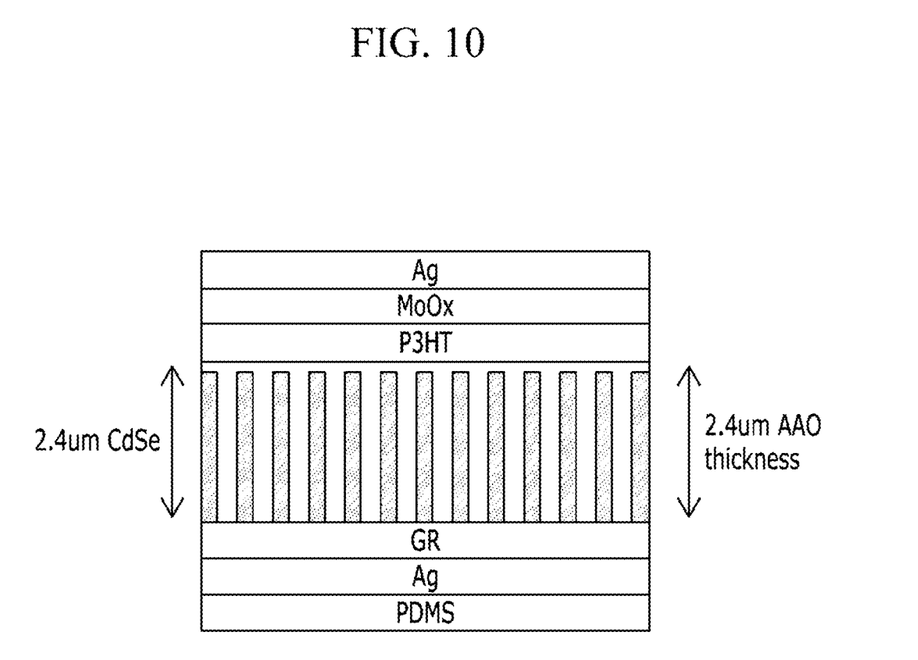
FIG. 10 is a cross-sectional view showing a piezoelectric solar cell designed by another example.

In order to evaluate how the energy efficiency of the piezoelectric solar cell is improved, a piezoelectric solar cell having the cross-sectional surface shown in FIG. 10 is fabricated.

Referring to FIG. 10, after forming a graphene layer (GR) on a PDMS (polydimethylsiloxane) substrate, a patterned AAO layer is formed on one surface of the graphene layer. Subsequently, the annealing process is performed to remove the PDMS substrate, and then an Ag electrode is deposited on the other surface of the graphene layer. Subsequently, piezoelectric nanowires are formed between the patterns of the AAO layer using CdSe applied using electrochemical deposition. Subsequently, a P3HT layer, a MoOx layer, and a Ag electrode are stacked to provide a piezoelectric solar cell.

Figure 11:
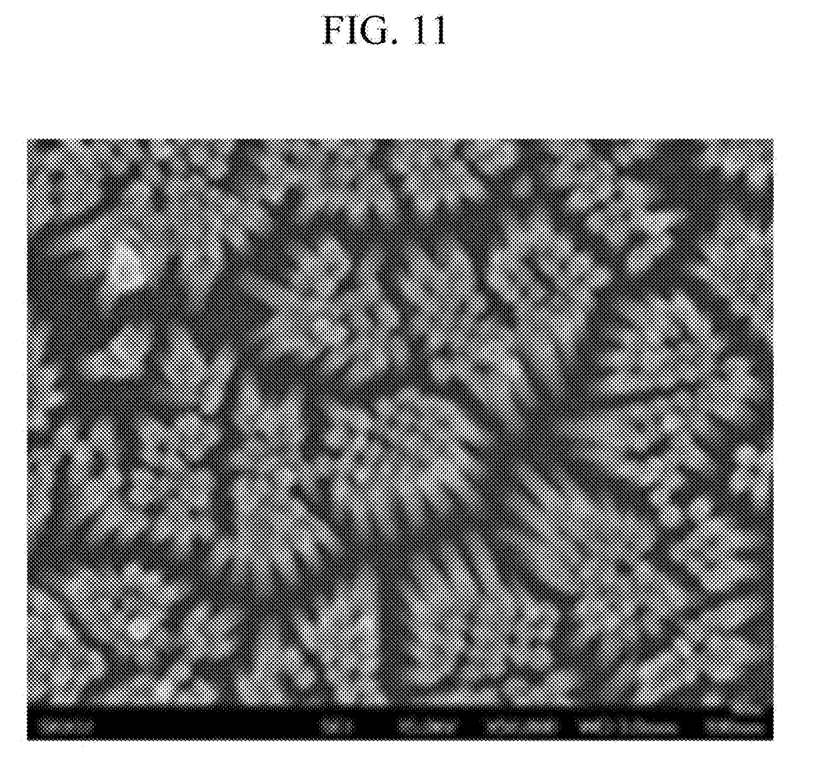
FIG. 11 is a SEM photograph showing piezoelectric nanowires of the piezoelectric solar cell shown in FIG. 10.
Figure 12:
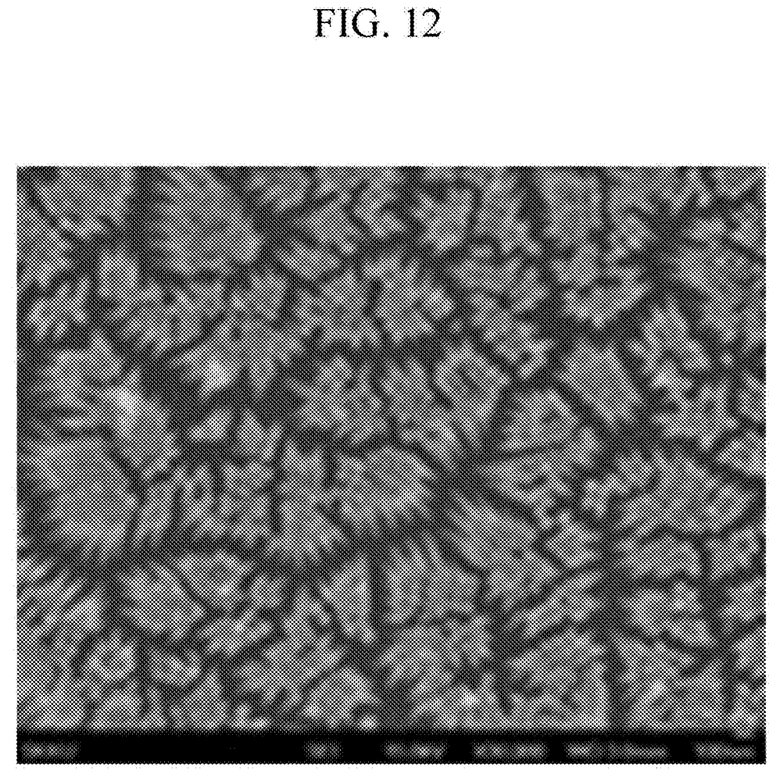
FIG. 12 is a SEM photograph showing piezoelectric nanowires when a graphene layer is omitted from the piezoelectric solar cell shown in FIG. 10, FIG. 13 show a voltage-current graph of the piezoelectric solar cell shown in FIG. 10 when irradiating ultraviolet (UV) light and applying a predetermined-sized force (a); a voltage-current graph when not applying both light and force (b); and a voltage-current graph when irradiating UV-light but not applying force (c)

FIG. 11 is a SEM (Scanning Electron Microscope) photograph showing piezoelectric nanowires of the obtained piezoelectric solar cell, and FIG. 12 is a SEM photograph showing piezoelectric nanowires of a piezoelectric solar cell in which the graphene layer is omitted.

Pressure is applied to the piezoelectric solar cell by bending the piezoelectric solar cell so as to shift the piezoelectric solar cell by about 3 mm in a horizontal direction. Specifically, by the way in which the piezoelectric solar cell is folded downward, the piezoelectric solar cell is subjected to a predetermined force used to evaluate a current according to a voltage.

Figure 13:
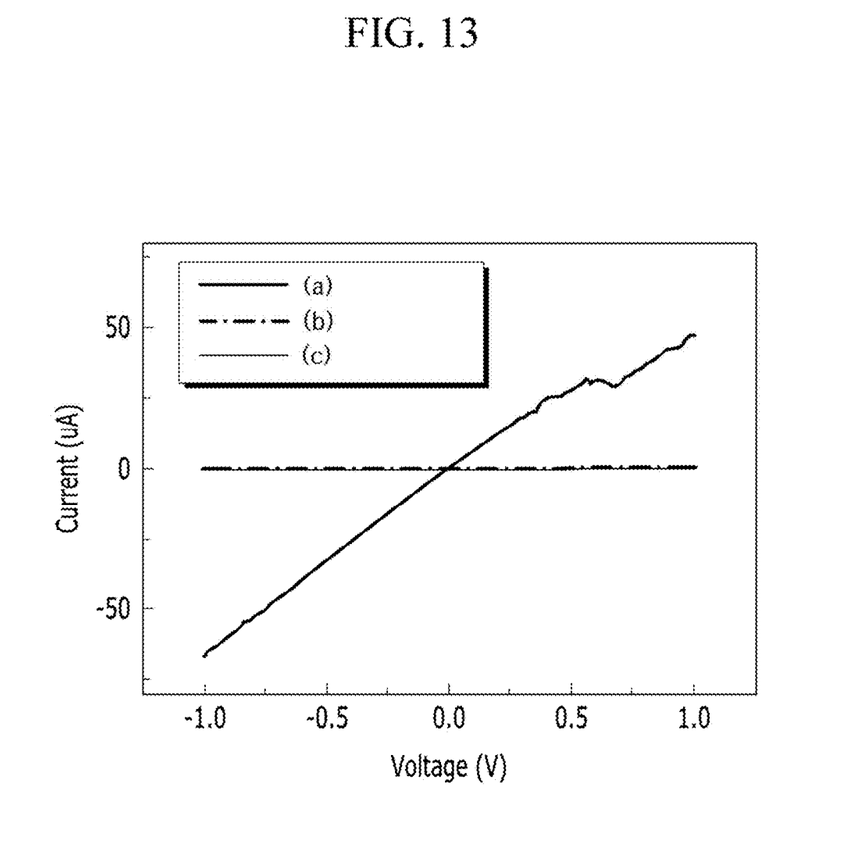
Figure 14:
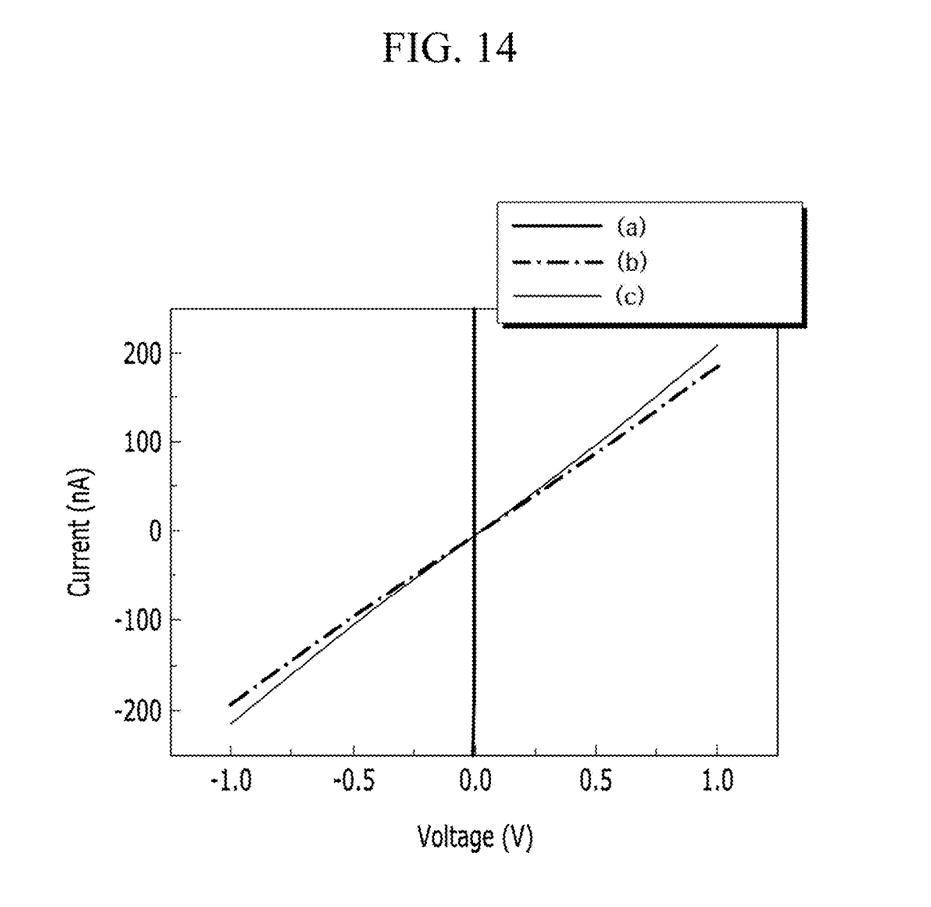
FIG. 14 is a graph enlarging the view of FIG. 13.

FIG. 13 shows (a) a voltage-current graph of the piezoelectric solar cell when applying a force within a predetermined range while irradiating ultraviolet light (UV-light); (b) a voltage-current graph when not applying either light or force to the piezoelectric solar cell; and (c) a voltage-current graph when irradiating the piezoelectric solar cell with UV-light but not applying force, and FIG. 14 is a graph enlarging FIG. 13. In (a) and (c), the irradiated ultraviolet (UV) light have the same intensity.

Referring to FIGS. 13 and 14, it is understood that the slope of the current-voltage graph when applying both light and force (a) is significantly higher than the slopes of the current-voltage graphs when not applying both light and force (b) and when irradiating light but not applying force (c). From the results, it is confirmed that by introducing a piezoelectric structure into a solar cell, the result is not merely a combination of a piezoelectric device with a photoelectric device, but also, the significant improvement of the photo-efficiency due to the force applied to the piezoelectric solar cell.

While this disclosure has been described in connection with practical exemplary embodiments, it is to be understood that the disclosure is not limited to the disclosed exemplary embodiments, but, on the contrary, is intended to cover various modifications and equivalent arrangements included within the spirit and scope of the appended claims.

What is claimed is:

1. An energy generating device comprising:
 a first electrode;
 a metal layer disposed on the first electrode, the metal layer comprising a regular arrangement of a plurality of patterns;
 an organic material layer disposed on the metal layer; and
 a piezoelectric layer disposed between the first electrode and the organic material layer.

2. The energy generating device of claim 1, wherein the piezoelectric layer is disposed within gaps between the adjacent ones of the plurality of patterns of the metal layer.

3. The energy generating device of claim 2, wherein the piezoelectric layer comprises a nanostructure.

4. The energy generating device of claim 1, further comprising a first auxiliary layer disposed between the first electrode and the metal layer, wherein the first auxiliary layer is electrically conductive.

5. The energy generating device of claim 4, wherein the first auxiliary layer comprises at least one of carbon nanotubes, a conductive polymer, and graphene.

6. The energy generating device of claim 1, further comprising a second electrode disposed on the organic material layer.

7. The energy generating device of claim 6, wherein the second electrode is transparent.

8. The energy generating device of claim 1, wherein the organic material layer comprises a p-type semiconductor material, and the piezoelectric layer comprises an n-type semiconductor material.

9. The energy generating device of claim 1, wherein the piezoelectric layer comprises at lease one piezoelectric material selected from a group consisting of PVDF (polyvinylidene fluoride), zinc oxide (ZnO), lead zirconate titanate (PZT), barium titanate (BaTiO3), lead titanate (PbTiO3), aluminum nitride (AlN), gallium nitride (GaN), cadmium selenide (CdSe), and silicon carbide (SiC).

* * * * *